United States Patent [19]

Nagaishi et al.

[11] Patent Number: 5,248,659
[45] Date of Patent: Sep. 28, 1993

[54] PROCESS FOR PREPARING A SUPERCONDUCTING THIN OXIDE FILM

[75] Inventors: Tatsuoki Nagaishi; Hisao Hattori; Hideo Itozaki, all of Hyogo, Japan

[73] Assignee: Sumitomo Electric Industries, Ltd., Osaka, Japan

[21] Appl. No.: 792,189

[22] Filed: Nov. 14, 1991

[30] Foreign Application Priority Data

Nov. 15, 1990 [JP] Japan .................................. 2-309455

[51] Int. Cl.$^5$ ............................................. B05D 3/06
[52] U.S. Cl. ........................................ 505/1; 156/603; 156/610; 156/614; 156/621; 156/622; 427/596; 505/729; 505/730; 505/732
[58] Field of Search ............... 156/603, 610, 614, 621, 156/622; 505/1, 729, 730, 732

[56] References Cited

U.S. PATENT DOCUMENTS

| | | | |
|---|---|---|---|
| 4,939,308 | 7/1990 | Mayfield et al. ..................... | 156/603 |
| 5,015,618 | 5/1991 | Levinson ............................. | 156/610 |
| 5,055,445 | 10/1991 | Belt et al. ........................... | 156/621 |

OTHER PUBLICATIONS

*Applied Physics Letters*, vol. 54, No. 18, May 1, 1989, New York, US, pp. 1802-1804; Kanal, M. et al: "Low-Temperature Formation of Multilayered Bi(Pb)-Sr-Ca-Cu-O Thin Films by Successive Deposition Using Laser Ablation".

*Japanese Journal of Applied Physics Letters*, vol. 28, No. 5, May 1989, Tokyo, JP, pp. 823-826; Tabata H. et al: "Tailored Thin Films of Superconducting Bi-Sr-Ca-Cu-O Oxide Prepared by Excimer Laser Ablation Technique".

*Journal of Applied Physic*, vol. 67, No. 6, Mar. 15, 1990, New York, US, pp. 3069-3071; Meskoob M. et al: "CO2-Laser Ablation of Bi-Sr-Ca-Cu Oxide by Millisecond Pulse Lengths".

*Applied Physics Letters*, vol. 56, No. 16, Apr. 16, 1990, New York, US, pp. 1576-1578; H. Tabata et al: "Tailored Thin Films of a Superconducting Bi-Sr-Ca-Cu Oxide Prepared by Incorporation of Exotic Atoms-Control of the Distance between CuO2 Layers".

Primary Examiner—Robert Kunemund
Assistant Examiner—Felisa Garrett
Attorney, Agent, or Firm—Lowe, Price, LeBlanc & Becker

[57] ABSTRACT

In a process for preparing a thin film of a Bi-Sr-Ca-Cu-O based oxide superconductor by a laser ablation method in which a target is irradiated with a pulsed laser beam to grow a thin film on a substrate positioned to face the target, the improvement wherein the pulse rate of the pulsed laser beam is adjusted to 0.01-10 Hz and the application of the laser beam is interrupted at each time a superconducting thin oxide film is grown to a thickness equivalent to one half the unit cell or one unit cell of a Bi-Sr-Ca-Cu-O based oxide superconductor, whereby a thin film of the oxide superconductor is grown at an average growth rate of no more than 0.5 Å/sec.

5 Claims, 1 Drawing Sheet

PROCESS FOR PREPARING A SUPERCONDUCTING THIN OXIDE FILM

BACKGROUND OF THE INVENTION

The present invention relates to a process for preparing a superconducting thin oxide film. More particularly, the present invention relates to a process for preparing a high-quality thin film of an oxide superconductor by a laser ablation method.

Among the various methods that can be used to prepare thin films, a laser ablation method which requires no electromagnetic fields of any kind, is considered to be suitable for preparing thin films of high quality.

While various types of lasers can be used as light sources, an excimer laser ablation method that uses an excimer laser as a light source is capable of preparing thin films at high rate and yet at low substrate temperature since the laser beam used has high energy in a short wavelength range from 150 nm to 400 nm. This method has the following additional advantages and has atracted the attention as a technique adapted for preparing thin films of oxide superconductors which are multicomponent compounds:

(1) a thin film having no compositional mismatch from the target can be obtained;
(2) film formation can be effected over a broad range of pressures up to about 1 Torr;
(3) the growth rate can be increased to an extremely high level; and
(4) the reaction involved is a non-thermal equilibrium process under illumination with high-energy beam.

However, the excimer laser involves pulsed oscillation and the duration of its light emission is usually very short on the order of 10-odd nanoseconds. Therefore, in the laser ablation method which uses such an excimer laser as a light source, the target is irradiated with intermittent pulsed laser beam.

In general, in the laser ablation method, particles or vapor are emitted from the target only for the period when the target is irradiated with laser beam. The emitted particles or vapor undergo reaction at the substrate surface to be deposited as a thin film on the surface. Having a high energy with an extremely short pulse width, the excimer laser can generate a large amount of particles or vapor per pulse of laser beam. Hence, a very rapid growth rate can be attained by increasing the number of pulses but, at the same time, insufficient crystallization may occur to deteriorate the quality of deposited film.

Another factor to be considered in forming superconducting thin oxide films is the film forming temperature (usually measured as the substrate temperature) which is typically as high as about 700° C. and above. To prevent the thermal deterioration or reaction of the substrate or substrate material used in thin film formation, it is desired to lower the film forming temperature. Particularly in the case where superconducting thin oxide films are applied to electronics engineering, lowering the film forming temperature is an essential technique. However, at lower film forming temperatures, the performance of superconducting thin oxide films will usually deteriorate to such a level that they have no commercial value.

As mentioned above, film formation occurs in the excimer laser ablation only for the period while pulsed laser beam is applied to the target and the particles or vapor being emitted from the target surface are kept supplied onto the substrate. Thus, in this method of film formation, a thin film is formed by successively depositing extremely thin layers (molecular layers) made of the particles or vapor sputtered from the target by respective pulses of laser beam.

The atoms and molecules of the particles or vapor that have reached the growing surface of the substrate will not be immediately stabilized and are subject to reaction or continued movement or diffusion at the atomic and molecular levels. The magnitude of such reaction, molecular movements and diffusion will eventually decrease to lie within a certain range to form a stable thin film but the time to this stabilization will vary with the energy supplied such as the substrate temperature and the energy of laser beam.

Therefore, a high-quality thin film of oxide superconductor can be prepared by properly selecting these conditions, as well as the pulse rate of pulsed laser beam and the average rate of film formation.

SUMMARY OF THE INVENTION

It is accordingly an object of the present invention to provide an improved laser ablation method capable of preparing a high-quality thin film of a Bi-Sr-Ca-Cu-O based oxide superconductor having superior superconducting characteristics.

In accordance with the present invention, there is provided a process for preparing a thin film of a Bi-Sr-Ca-Cu-O based oxide superconductor by a laser ablation method in which a target is irradiated with a pulsed laser beam to grow a thin film on a substrate positioned to face the target, and this process is characterized in that the pulse rate of the pulsed laser beam is adjusted to 0.01–10 Hz and the application of the laser beam is interrupted at each time a superconducting thin oxide film is grown to a thickness equivalent to one half the unit cell or one unit cell of a Bi-Sr-Ca-Cu-O based oxide superconductor, whereby a thin film of the oxide superconductor is grown at an average growth rate of no more than 0.5 Å/sec.

The process of the present invention is principally characterized in that the pulse rate of pulsed laser beam used in the laser ablation method and the growth rate of a thin film are controlled at appropriate values so as to prepare a high-quality thin film of a Bi-Sr-Ca-Cu-O based oxide superconductor.

In the process of the present invention, the pulse rate of the pulsed laser beam is adjusted to 0.01–10 Hz, and the application of the laser beam is interrupted at each time a superconducting thin oxide film is grown to a thickness equivalent to one half the unit cell or one unit cell of a Bi-Sr-Ca-Cu-O based oxide superconductor, whereby a thin film of the oxide superconductor is grown at an average growth rate of no more than 0.5 Å/sec.

In the case of preparing a superconducting thin oxide film by a laser ablation method, the quality of the resulting thin film can generally be improved by slowing down the film growth rate within a certain range. In the laser ablation method by a pulsed laser, the film growth rate can be slowed down by reducing either the pulse rate of laser beam or emitting energy per pulse. However, if the pulse rate is lower than 1 Hz, the amount of re-evaporation of elements will increase to cause a compositional mismatch in the product thin film. If, on the other hand, the energy of laser beam is reduced, the state of a plasma generally referred to as a "plume" will experience an unwanted change. Therefore, in the prior art, the pulse rate of pulsed laser beam has been 1 Hz while the film growth rate is about 2 Å/sec.

In the process of the present invention, the pulse rate is adjusted to 0.01-10 Hz and the application of pulsed laser beam is suspended at each time a thin film of superconducting thin oxide film is grown to a thickness equivalent to one half the unit cell or one unit cell of a Bi-Sr-Ca-Cu-O based oxide superconductor, whereby a thin film of the oxide superconductor is grown at an average growth rate of no more than 0.5 Å/sec. The vapor or particles of the starting material emitted from the target by irradiation with pulsed laser beam at the pulse rate of 0.01-10 Hz are deposited on the substrate. The deposit is not a perfect crystal but while the application of laser beam is suspended, the reaction will proceed, causing the individual atoms and molecules to shift to the appropriate positions so as to form a unit cell of the crystal. This process is repeated to prepare a desired thin film in the method of the present invention, which therefore is capable of preparing a thin film of high-quality, single-crystal Bi-Sr-Ca-Cu-O based oxide superconductor.

DETAILED DESCRIPTION OF THE PREFERRED EMBODIMENTS

Figure 1:
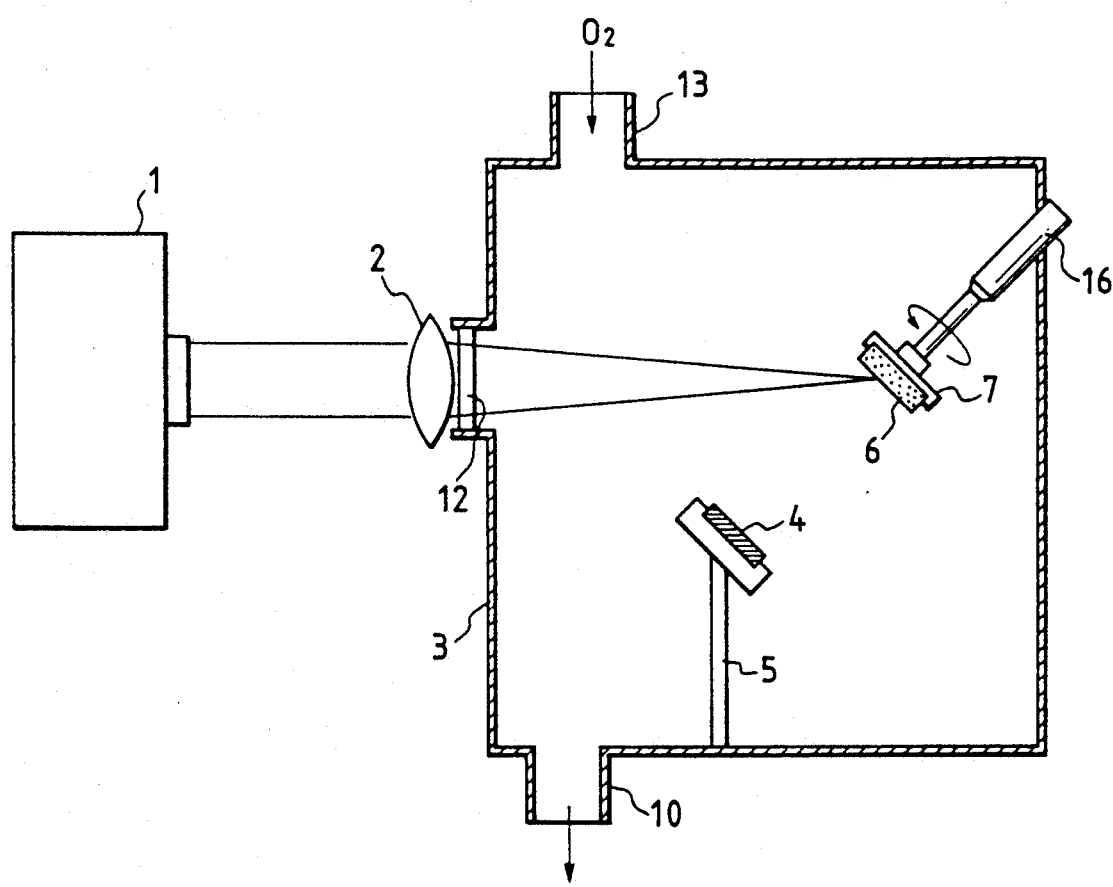
FIG. 1 shows diagrammatically an example of the laser ablation equipment that is used to implement the process of the present invention.

The present invention will be described below in greater detail by reference to an example which, however, is given here for illustrative purposes only and should in no way be taken to limit the technical scope of the invention.

FIG. 1 shows diagrammatically an example of the laser ablation equipment that can be used to implement the process of the present invention. The laser ablation equipment shown in FIG. 1 comprises a chamber 3 having a laser admitting window 12, an oxygen inlet 13 and gas outlet 10 through which the interior of the chamber can be evacuated to high vacuum, a substrate holder 5 that is placed within the chamber 3 and that is equipped with a substrate heater (not shown), and a target holder 7 rotated by a motor 16.

An excimer laser apparatus 1 and a condenser lens 2 for collecting laser beam are positioned outside the chamber 3.

The laser beam emitted from the laser apparatus 1 is collected by the condenser lens 2 to be admitted into the chamber 3 through the window 12 so that it illuminates a target 6 of starting material fixed on the target holder 7. The laser beam is focused in such a way that it illuminates a slightly off-centered position of the target 6. Since the target 6 is rotated by means of the motor 16, there is no possibility with the equipment shown in FIG. 1 that the target 6 is unevenly illuminated with the laser beam.

Using the equipment described above, a superconducting thin oxide film was prepared by the process of the present invention. A single crystal of MgO was used as a substrate 4.

The target 6 was a disk of sintered $Bi_3Sr_2Ca_2Cu_3O_x$ powder. The substrate temperature was set at 650° C. Temperature measurement was conducted using a sheath thermocouple calibrated with a normal thermocouple.

After evacuating the chamber 3 to $1 \times 10^{-7}$ Torr, oxygen gas was introduced through the inlet 13 to increase the pressure to 400 mTorr. Subsequently, an excimer laser beam was applied to the target surface at 1.5 J/cm$^2$ and 1 Hz. Following ten applications of the excimer laser beam onto the target 6, the laser application was ceased for 2 minutes and 50 cycles of this procedure were repeated until a thin film was formed in a thickness of 100 nm.

The thin film obtained was checked for the temperature dependency of electric resistance and the temperature for zero resistance, or the Curie point (Tc), was 80 K. A thin film was prepared under the same conditions except that the application of laser beam was not interrupted and the film obtained showed no superconductivity.

An X-ray diffraction scan of the thin film prepared in accordance with the present invention showed that it was composed of a c-axis oriented, single-phase $Bi_2Sr_2Ca_2Cu_3O_x$ oxide superconductor.

Examination under a scanning electron microscope (SEM) showed that the thin film had a very smooth surface with a surface roughness of about 3 nm as measured with a surface roughness meter As described above, the process of the present invention enables high-quality thin films of oxide superconductors to be prepared by the laser ablation method. The superconducting thin oxide films prepared by the process of the present invention are optimal for use in electronic devices such as Josephson devices and superconducting transistors.

What is claimed is:

1. A process for preparing a thin film of a Bi-Sr-Ca-Cu-O based oxide superconductor, comprising the steps of:

positioning a substrate to face a Bi-Sr-Ca-Cu-O target in a chamber;

adjusting a pulse rate of a pulsed laser beam;

irradiating said target with said pulsed laser beam;

interrupting application of said pulsed laser beam to the target at each time a superconducting thin oxide film is grown on said substrate to a thickness equivalent to one half the unit cell or one unit cell of a Bi-Sr-Ca-Cu-O based oxide superconductor; and repeating the irradiating step and the interrupting step, whereby said superconducting thin oxide film is grown at an average growth rate of no more than 0.5 Å/sec.

2. A process according to claim 1, wherein said pulse rate of said pulsed laser beam is adjusted within a range of 0.01 to 10 Hz.

3. A process according to claim 1, further comprising the steps of introducing oxygen gas into said chamber up to about 400 mTorr and heating said substrate up to about 650° C. prior to the irradiating step.

4. A process according to claim 1, wherein said pulsed laser beam is an excimer laser beam having energy of 1.5 J/cm$^2$ and pulse rate of 1 Hz.

5. A process according to claim 1, wherein the target comprises sintered $Bi_3Sr_2Ca_2Cu_3O_x$ powder.

* * * * *